US 6,710,433 B2

(12) United States Patent
Megahed et al.

(10) Patent No.: US 6,710,433 B2
(45) Date of Patent: Mar. 23, 2004

(54) LEADLESS CHIP CARRIER WITH EMBEDDED INDUCTOR

(75) Inventors: Mohamed Megahed, San Diego, CA (US); Hassan S. Hashemi, Laguna Niguael, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 172 days.

(21) Appl. No.: 09/930,747

(22) Filed: Aug. 14, 2001

(65) Prior Publication Data

US 2002/0172025 A1 Nov. 21, 2002

Related U.S. Application Data

(63) Continuation-in-part of application No. 09/713,834, filed on Nov. 15, 2000.

(51) Int. Cl.⁷ .................................................. H01L 23/48
(52) U.S. Cl. ....................... 257/678; 257/724; 257/706; 174/264
(58) Field of Search ................................. 257/780, 707, 257/712, 737, 738, 706, 786, 724, 516; 174/266, 52.1, 252, 260, 262

(56) References Cited

U.S. PATENT DOCUMENTS

| | | |
|---|---|---|
| 5,506,755 A | 4/1996 | Miyagi et al. |
| 5,640,048 A * | 6/1997 | Selna .......................... 257/738 |
| 5,646,826 A | 7/1997 | Katchmar |
| 5,721,454 A | 2/1998 | Palmer |
| 5,786,628 A | 7/1998 | Beilstein, Jr. et al. |
| 5,808,873 A | 9/1998 | Celaya et al. |
| 5,814,889 A | 9/1998 | Gaul |
| 5,923,084 A | 7/1999 | Inoue et al. |
| 6,097,089 A * | 8/2000 | Gaku et al. .................. 257/712 |
| 6,191,477 B1 * | 2/2001 | Hashemi ...................... 257/706 |
| 6,201,300 B1 | 3/2001 | Tseng et al. |
| 6,226,183 B1 | 5/2001 | Weber et al. |
| 6,236,366 B1 | 5/2001 | Yamamoto et al. |
| 6,265,767 B1 | 7/2001 | Gaku et al. |
| 6,265,771 B1 | 7/2001 | Ference et al. |
| 6,265,772 B1 | 7/2001 | Yoshida |
| 6,281,042 B1 | 8/2001 | Ahn et al. |
| 6,282,095 B1 | 8/2001 | Houghton et al. |
| 6,421,013 B1 | 7/2002 | Chung |

\* cited by examiner

Primary Examiner—Jerome Jackson
Assistant Examiner—Lourdes Cruz
(74) Attorney, Agent, or Firm—Farjami & Farjami LLP

(57) ABSTRACT

One embodiment comprises a substrate having a top surface for receiving a semiconductor die. According to a disclosed embodiment, an inductor is patterned on the top surface of the substrate. The inductor is easily accessible by connecting its first and second terminals to, respectively, a substrate signal bond pad and a semiconductor die signal bond pad. In another disclosed embodiment, an inductor is fabricated within the substrate. The inductor comprises via metal segments connecting interconnect metal segments on the top and bottom surfaces of the substrate. The first and second terminals of the inductor are easily accessible through first and second substrate signal bond pads. One embodiment comprises at least one via in the substrate. The at least one via provides an electrical connection between a signal bond pad of the semiconductor die and a printed circuit board attached to the bottom surface of the substrate.

20 Claims, 8 Drawing Sheets

LEADLESS CHIP CARRIER WITH EMBEDDED INDUCTOR

This application is a continuation in part of, and claims benefit of the filing date of, and hereby incorporates fully be reference, the pending parent application entitled "Leadless Chip Carrier Design and Structure" Ser. No. 09/713,834 filed Nov. 15, 2000 and assigned to the assignee of the present application.

BACKGROUND OF THE INVENTION

1. Field of the Invention

The present invention is generally in the field of semiconductor chip packaging. More specifically, the present invention is in the field of leadless chip carrier design and structure.

2. Background Art

The semiconductor fabrication industry is continually faced with a demand for smaller and more complex dies. These smaller and more complex dies must also run at higher frequencies. The requirement of smaller, more complex, and faster devices has resulted in new challenges not only in the fabrication of the die itself, but also in the manufacturing of various packages, structures, or carriers that are used to house the die and provide electrical connection to "off-chip" devices.

As an example, the demand for higher frequencies means, among other things, that "on-chip" and "off-chip" parasitics must be minimized. For example, parasitic inductance, capacitance, and resistance, which all adversely affect electrical performance of the die and its associated off-chip components must be minimized. Since RF ("Radio Frequency") semiconductor devices run at high frequencies, those devices (i.e. RF devices) constitute a significant category of devices that specially require very low parasitics.

Recently, surface mount chips and chip carriers have gained popularity relative to discrete semiconductor packages. A discrete semiconductor package typically has a large number of "pins" which may require a relatively large space, also referred to as the "footprint," to mount and electrically connect the discrete semiconductor package to a printed circuit board. Moreover, the cost and time associated with the manufacturing of the discrete semiconductor package and the cost and time associated with drilling a large number of holes in the printed circuit board are among additional reasons why alternatives such as surface mount devices and chip carriers have gained popularity.

There have been various attempts in the art to arrive at different chip carrier designs. Japanese Publication Number 10313071, published Nov. 24, 1998, titled "Electronic Part and Wiring Board Device," on which Minami Masumi is named an inventor, discloses a structure in which to dissipate heat emitted by a semiconductor device. The structure provides metallic packed through-holes formed in a wiring board that transmit heat emitted from a bare chip through a heat dissipation pattern on the bottom of the wiring board, and then to a heat dissipation plate.

Japanese Publication Number 02058358, published Feb. 27, 1990, titled "Substrate for Mounting Electronic Component," on which Fujikawa Osamu is named an inventor, discloses a substrate with a center area comprising eight thermally conductive resin-filled holes sandwiched between metal-plated top and bottom surfaces. An electronic component is then attached to the center area of the top metal-plated surface of the substrate with silver paste adhesive to improve heat dissipation and moisture resistance.

Japanese Publication Number 09153679, published Jun. 10, 1997, titled "Stacked Glass Ceramic Circuit Board," on which Miyanishi Kenji is named an inventor, discloses a stacked glass ceramic circuit board comprising seven stacked glass ceramic layers. The multi-layer stacked glass ceramic circuit board further comprises a number of via holes comprising gold or copper with surface conductors on the top and bottom surfaces covering the via holes. The top conductor functions as a heat sink for an IC chip.

Japanese Publication Number 10335521, published Dec. 18, 1998, titled "Semiconductor Device," on which Yoshida Kazuo is named an inventor, discloses a thermal via formed in a ceramic substrate, with a semiconductor chip mounted above the thermal via. The upper part of the hole of the thermal via is formed in a ceramic substrate in such a manner that it becomes shallower as it goes outward in a radial direction.

A conventional chip carrier structure for mounting a chip on a printed circuit board has a number of shortcomings. For example, conventional chip carriers still introduce too much parasitics and still do not provide a low inductance and resistance ground connection to the die. Conventional chip carriers also have a very limited heat dissipation capability and suffer from the concomitant reliability problems resulting from poor heat dissipation. As an example, in high frequency applications, such as in RF applications, several watts of power are generated by a single die. Since the semiconductor die and the chip carrier are made from different materials, each having a different coefficient of thermal expansion, they will react differently to the heat generated by the die. The resulting thermal stresses can cause cracking or a separation of the die from the chip carrier and, as such, can result in electrical and mechanical failures. Successful dissipation of heat is thus important and requires a novel structure and method.

The requirement of smaller, more complex, and faster devices operating at high frequencies, such as wireless communications devices and Bluetooth RF transceivers, has also resulted in an increased demand for small size, high quality factor ("high-Q") inductors. One attempt to satisfy the demand for small, high-Q inductors has been to fabricate on-chip inductors. However, size and line thickness limitations directly impact the quality factor obtainable in on-chip inductors. Discrete, "off-chip" inductors represent another attempt to satisfy the demand for small, high-Q inductors. However, discrete, "off-chip" inductors suffer from various disadvantages not shared by on-chip inductors. For example, the discrete, "off-chip" inductor requires the assembly of at least two components, i.e. the chip itself and the off-chip inductor. The required assembly of two or more components introduces corresponding reliability issues and also results in a greater manufacturing cost.

Additionally, off-chip inductors require relatively long off-chip wires and interconnect lines to provide electrical connection to the chip and to "off-chip" devices. The relatively long off-chip wires and interconnect lines result in added and unwanted parasitics. Further, the interconnects for off-chip inductors are subject to long-term damage from vibration, corrosion, chemical contamination, oxidation, and other chemical and physical forces. Exposure to vibration, corrosion, chemical contamination, oxidation, and other chemical and physical forces results in lower long-term reliability for off-chip inductors.

Thus, there is a need for a small, high-Q inductor that is embedded in the structure that houses and supports the semiconductor die. Additionally, the structure in which the high-Q inductor is embedded needs to provide low parasitics, efficient heat dissipation and a low inductance and resistance ground connection.

Moreover, there exists a need for a novel and reliable structure and method that houses, supports, and electrically connects a semiconductor die to an inductor embedded in the structure and which overcomes the problems faced by discrete inductors, discrete semiconductor packages, and conventional chip carriers. More specifically, there exists a need for a novel and reliable structure and method to embed an inductor in a structure that houses, supports and is electrically connected to a semiconductor die, while providing low parasitics, efficient heat dissipation and a low inductance and resistance ground.

SUMMARY OF THE INVENTION

The present invention is directed to structure and method for fabrication of a leadless chip carrier with embedded inductor. The present invention discloses a structure that provides efficient dissipation of heat generated by a semiconductor die. The present invention further discloses a structure that includes an embedded inductor and also provides low parasitics, and a low inductance and resistance ground connection to the semiconductor die.

In one embodiment, the present invention comprises a substrate having a top surface for receiving a semiconductor die. For example, the substrate can comprise an organic material such as polytetrafluoroethylene material or an FR4 based laminate material. By way of further example, the substrate can comprise a ceramic material. According to one aspect of the present invention, an inductor is patterned on the top surface of the substrate. The inductor is easily accessible by connecting its first and second terminals to, respectively, a substrate signal bond pad and a semiconductor die signal bond pad. In another aspect of the present invention, an inductor is fabricated within the substrate. The inductor comprises via metal segments connecting interconnect metal segments on the top and bottom surfaces of the substrate. The first and second terminals of the inductor are easily accessible through first and second substrate signal bond pads. The present invention may further comprise a printed circuit board attached to the bottom surface of the substrate.

In one embodiment, the invention comprises at least one via in the substrate. The invention's at least one via provides an electrical connection between a signal bond pad of the semiconductor die and the printed circuit board. The at least one via can comprise an electrically and thermally conductive material such as copper. The at least one via provides an electrical connection between a substrate bond pad and the printed circuit board. The substrate bond pad is connected to the signal bond pad of the semiconductor die by a signal bonding wire. The at least one via also provides an electrical connection between the signal bond pad of the semiconductor die and a land that is electrically connected to the printed circuit board.

DETAILED DESCRIPTION OF THE INVENTION

The present invention is directed to structure and method for fabrication of a leadless chip carrier with embedded inductor. The following description contains specific information pertaining to various embodiments and implementations of the invention. One skilled in the art will recognize that the present invention may be practiced in a manner different from that specifically discussed in the present application. Moreover, some of the specific details of the invention are not discussed in order not to obscure the invention. The specific details not described in the present application are within the knowledge of a person of ordinary skills in the art.

The drawings in the present application and their accompanying detailed description are directed to merely example embodiments of the invention. To maintain brevity, other embodiments of the invention that use the principles of the present invention are not specifically described in the present application and are not specifically illustrated by the present drawings.

Figure 1:
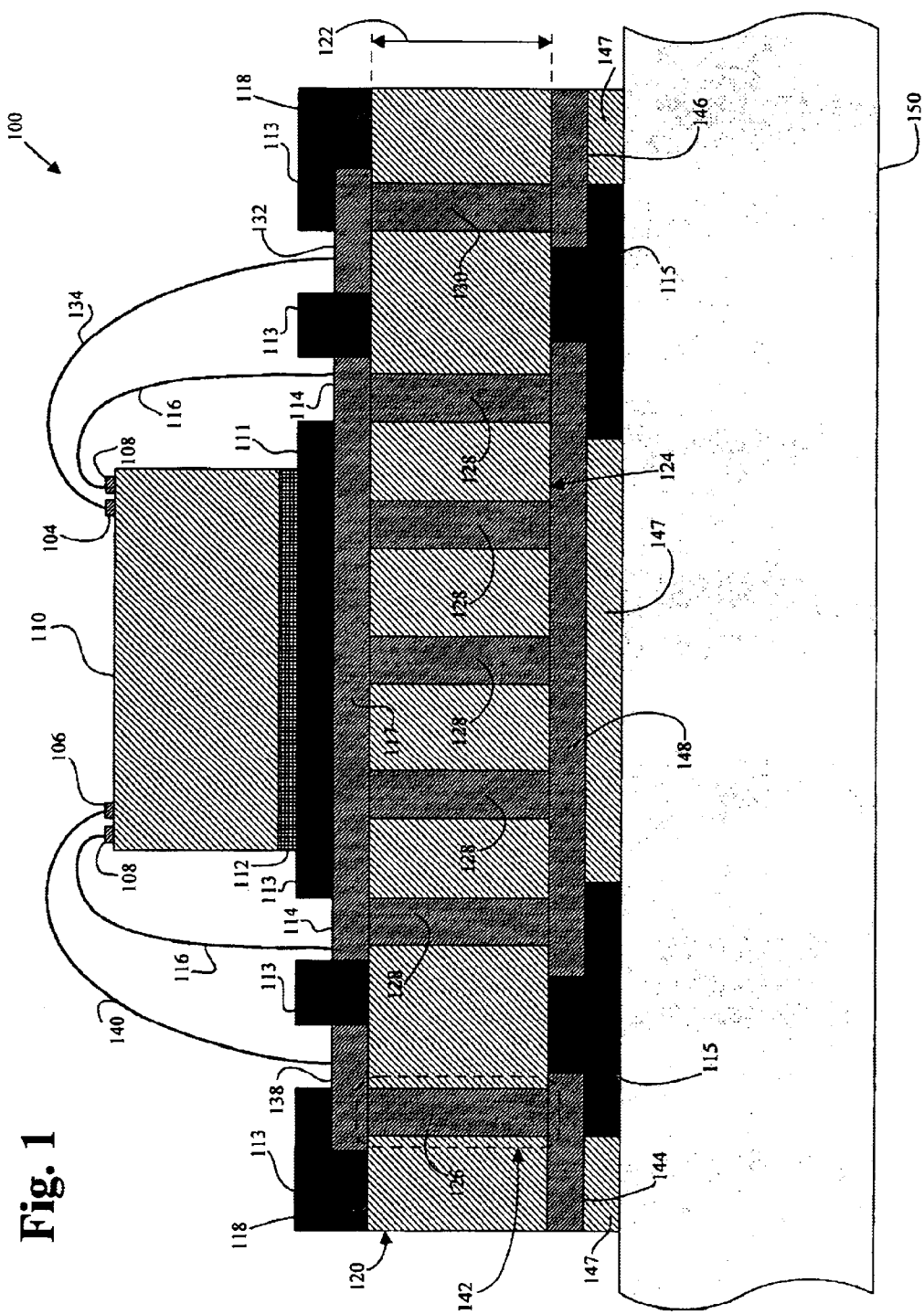
FIG. 1 illustrates a cross-sectional view of an embodiment of the present invention.

Structure 100 in FIG. 1 illustrates a cross-sectional view of an exemplary structure in accordance with one embodiment of the present invention. Structure 100 is shown as attached to printed circuit board ("PCB") 150 in FIG. 1. Referring to structure 100, semiconductor die 110 is attached to die attach pad 111 by die attach 112. It is noted that a "semiconductor die," such as semiconductor die 110, is also referred to as a "chip" or a "semiconductor chip" in the present application. Die attach pad 111 can be AUS-5 solder mask and it (i.e. die attach pad 111) refers to the segment of the solder mask directly below semiconductor die 110. The solder mask formation and patterning is discussed in more detail in later sections of the present application. However, die attach pad 111 may comprise materials other than solder mask. The thickness of die attach pad 111 can be, for example, 10.0 to 30.0 microns. Die attach 112 can comprise silver-filled epoxy or bismalemide. Generally die attach 112 can be an electrically conductive or electrically insulative, thermoset adhesive, or a combination thereof. However, in the present embodiment of the invention, die attach 112 is electrically and thermally conductive.

Solder mask 113 is applied to top surface 118 of substrate 120. The thickness of solder mask 113 can be, for example, 10.0 to 30.0 microns. Solder mask 113 can also be AUS-5; however, solder mask 113 may comprise other materials. Solder mask 115 is applied to bottom surface 124 of substrate 120. The thickness of solder mask 115 can be, for example, 10.0 to 30.0 microns. Solder mask 115 can also be AUS-5; however, solder mask 115 may comprise other materials. Support pad 117 is fabricated on top surface 118 of substrate 120 and, in one embodiment, support pad 117 can be copper. However, support pad 117 can comprise other metals. For example, support pad 117 can be aluminum, molybdenum, tungsten, or gold. It is noted that in one embodiment of the invention, semiconductor die 110 can be soldered directly to support pad 117. The fabrication of support pad 117 will be further described below in relation to FIG. 5.

Substrate down bond area 114 is fabricated on top surface 118 of substrate 120. In structure 100 in FIG. 1, substrate down bond area 114 can comprise nickel-plated copper. Substrate down bond area 114 can further comprise a layer of gold plating over the nickel-plated copper. However, substrate down bond area 114 can comprise other metals. For example, substrate down bond area 114 can be aluminum, molybdenum, tungsten, or gold. The fabrication of substrate down bond area 114 will be further described below in relation to FIG. 5. A first end of down bonding wire 116 is bonded to semiconductor die ground bond pad 108, on semiconductor die 110. A second end of down bonding wire 116 is bonded to substrate down bond area 114. Down bonding wire 116 can be gold, or can comprise other metals such as aluminum. The diameter of down bonding wire 116 can be approximately 30.0 microns or other diameter of choice.

Substrate 120 can comprise a two-layer organic laminate such as polytetrafluoroethylene. However, substrate 120 can comprise other organic materials such as FR4 based laminate. In one embodiment of the present invention, substrate 120 can be a ceramic material. In structure 100 in FIG. 1, thickness 122 of substrate 120 is approximately 200.0 microns; however, the thickness of substrate 120 can be different in other embodiments of the invention.

Continuing with FIG. 1, vias 128, also referred to as a first plurality of vias, and via 126 and via 130, also referred to as a second plurality of vias, are situated within substrate 120. Via 126, via 130, and vias 128 extend from top surface 118 to bottom surface 124 of substrate 120. Vias 126, via 130, and vias 128 can comprise a thermally conductive material. Vias 126, via 130, and vias 128 can comprise copper and, in fact, in exemplary structure 100, via 126, via 130, and vias 128 are filled with copper. However, via 126, via 130, and vias 128 can be filled with other metals without departing from the scope of the present invention. In another embodiment of the present invention, via 126, via 130, and vias 128 may not be completely filled with a metal. Generally, vias 128, via 126, and via 130 have similar structures. As such, and by way of an illustrative example, the structure of exemplary via 126 will be described in greater detail in relation to FIGS. 2A and 2B, and specifically with respect to the region enclosed by dashed line 142 (which corresponds to the region enclosed by dashed line 242 in FIG. 2B).

As shown in FIG. 1, a first end of signal bonding wire 134 is bonded to semiconductor die signal bond pad 104 on semiconductor die 110. A second end of signal bonding wire 134 is bonded to substrate signal bond pad 132. Signal bonding wire 134 can be gold or can comprise other metals such as aluminum. The diameter of signal bonding wire 134 can be 30.0 or other diameter of choice. As farther shown in FIG. 1, a first end of signal bonding wire 140 is bonded to semiconductor die signal bond pad 106 on semiconductor die 110. A second end of signal bonding wire 140 is bonded to substrate signal bond pad 138. Signal bonding wire 140 can be gold or can comprise other metals such as aluminum. The diameter of signal bonding wire 140 can be 30.0 or other diameter of choice.

In FIG. 1, substrate signal bond pad 132 is fabricated on top surface 118 of substrate 120. In structure 100, substrate signal bond pad 132 can comprise nickel-plated copper. Substrate signal bond pad 132 can further comprise a layer of gold plating over the nickel-plated copper. However, substrate signal bond pad 132 can comprise other metals. For example, substrate signal bond pad 132 can be aluminum, molybdenum, tungsten, or gold. The fabrication of substrate signal bond pad 132 will be farther described below in relation to FIG. 5. In structure 100 in FIG. 1, substrate signal bond pad 132 overlaps via 130. In another embodiment of the present invention, instead of overlapping via 130, substrate signal bond pad 132 "abuts" via 130.

Similar to substrate signal bond pad 132, substrate signal bond pad 138 is fabricated on top surface 118 of substrate 120. In structure 100, substrate signal bond pad 138 can comprise nickel-plated copper. Substrate signal bond pad 138 can further comprise a layer of gold plating over the nickel-plated copper. However, substrate signal bond pad 138 can comprise other metals. For example, substrate signal bond pad 138 can be aluminum, molybdenum, tungsten, or gold. The fabrication of substrate signal bond pad 138 will be further described below in relation to FIG. 5. In structure 100, substrate signal bond pad 138 overlaps via 126. In another embodiment of the present invention, substrate signal bond pad 138 abuts via 126.

Also shown in FIG. 1, land 144 is fabricated on bottom surface 124 of substrate 120. In structure 100, land 144 can comprise copper; however, land 144 can comprise other metals such as aluminum, molybdenum, tungsten, or gold. The fabrication of land 144 will be further described below in relation to FIG. 5. Land 144 is attached to printed circuit board ("PCB") 150 by solder 147. However, other methods known in the art may be used to attach land 144 to PCB 150. In structure 100, land 144 overlaps via 126. In another embodiment of the present invention, instead of overlapping via 126, land 144 abuts via 126.

Similar to land 144, land 146, is fabricated on bottom surface 124 of substrate 120. In structure 100, land 146 can be copper; however, land 146 can comprise other metals such as aluminum, molybdenum, tungsten, or gold. The fabrication of land 144 will be further described below in relation to FIG. 5. In structure 100 in FIG. 1, land 146 is attached to PCB 150 by solder 147. However, other methods known in the art may be used to attach land 146 to PCB 150. In structure 100, land 146 overlaps via 130. In another embodiment of the present invention, land 144 can abut via 126.

Further shown in FIG. 1, heat spreader 148 is fabricated on bottom surface 124 of substrate 120. In structure 100, heat spreader 148 can be copper; however, heat spreader 148 can comprise other metals such as aluminum, molybdenum, tungsten, or gold. In exemplary structure 100, heat spreader 148 is attached to PCB 150 by solder 147. However, other methods known in the art may be used to attach heat spreader 148 to PCB 150. The fabrication of heat spreader 148 will be discussed in detail in relation to FIG. 5.

Figure 2A:
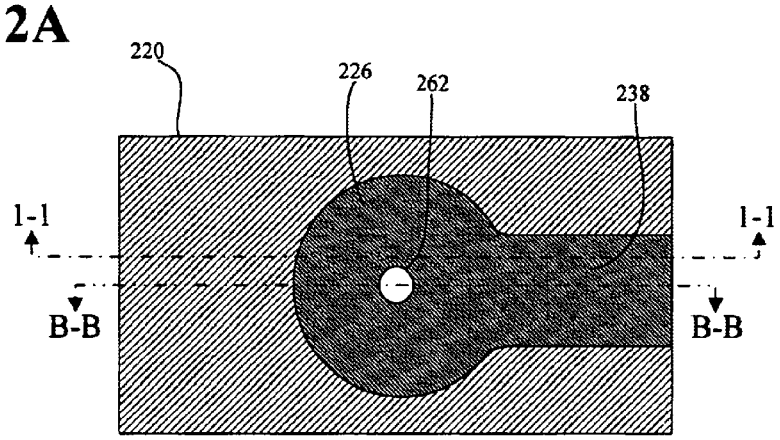
FIGS. 2A and 2B illustrate, respectively, a top view and a cross-sectional view of an exemplary via in an embodiment of the present invention.
Figure 2B:
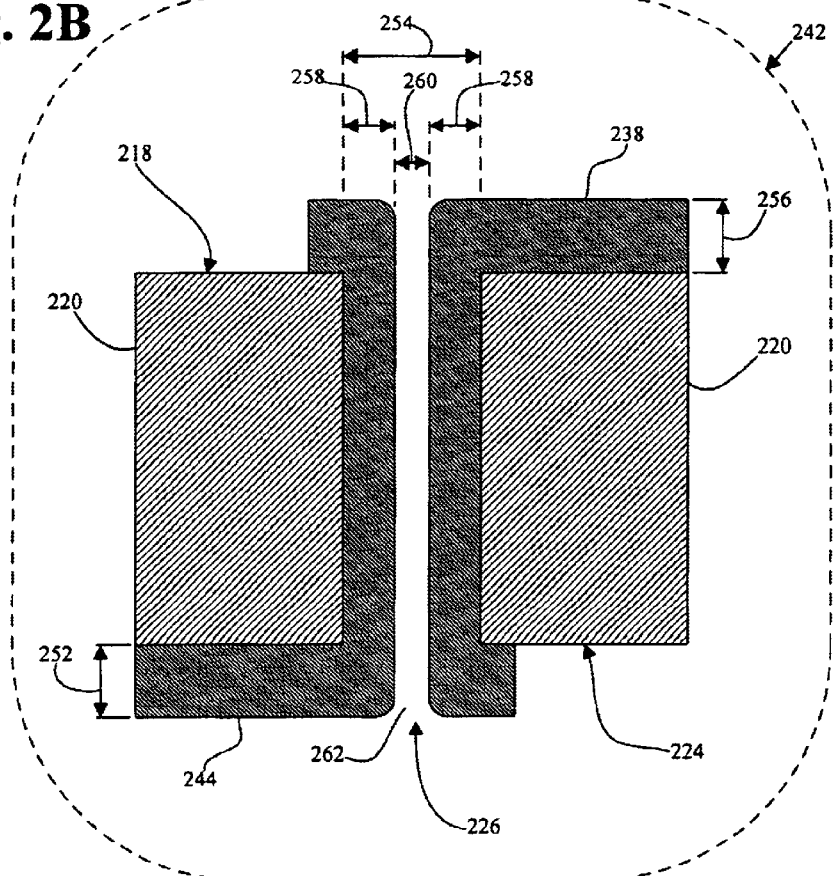

FIG. 2A shows a top view of region 242 in FIG. 2B, which corresponds to region 142 in FIG. 1. In particular, substrate 220, via 226, and substrate signal bond pad 238, respectively, correspond to substrate 120, via 126, and substrate signal bond pad 138 in FIG. 1. FIG. 2A also shows via hole 262. Via hole 262 cannot be seen in FIG. 1 which is a cross-sectional view along line 1—1 of FIG. 2A. However, via hole 262 can be seen in FIG. 2B since FIG. 2B is a cross-sectional view along line B—B of FIG. 2A. Via 226, bond pad 238, and via hole 262 will be described in detail below in relation to FIG. 2B.

FIG. 2B shows a cross-sectional view of region 242 along line B—B of FIG. 2A. However, region 142 in FIG. 1 shows a cross-sectional view along line 1—1 of FIG. 2A. In particular, top surface 218, substrate 220, bottom surface 224, via 226, substrate signal bond pad 238, and land 244 correspond, respectively, to top surface 118, substrate 120, bottom surface 124, via 126, substrate signal bond pad 138, and land 144 in FIG. 1.

In FIG. 2B, land pad thickness 252 can be approximately 12.7 to 30.0 microns. Via drill diameter 254 can be 150.0 microns while bond pad thickness 256 can be approximately 12.7 to 30.0 microns. Via wall thickness 258 can be approximately 20.0 microns. Via hole diameter 260 can be approximately 110.0 microns. It is noted that, for the purpose of ease of illustration, the various dimensions in FIGS. 2A and 2B are not drawn to scale.

The fabrication of via 226 begins with substrate 220. In one embodiment of the present invention, copper can be laminated on top surface 218 and bottom surface 224 of substrate 220. The thickness of the copper laminated on top surface 218 and bottom surface 224 of substrate 220 can be, for example, 15.0 microns. However, other metals may be laminated on top surface 218 and bottom surface 224 of substrate 220. For example, the metal laminated on top surface 218 and bottom surface 224 of substrate 220 can be aluminum, molybdenum, tungsten, or gold. Next, a via opening having via drill diameter 254 is drilled through substrate 220 at a predetermined location. Substrate 220 is then plated with copper to produce a layer of copper on the inside of the via opening corresponding to via wall thickness 258. However, substrate 220 may be plated with other metals. Thus, via 226 is fabricated having via hole diameter 262 as shown in FIGS. 2A and 2B. Via 226 has via hole diameter 262 in FIGS. 2A and 2B. The process illustrated above to fabricate via 226 also applies to the fabrication of via 130 and vias 128 in structure 100 in FIG. 1.

Figure 3:
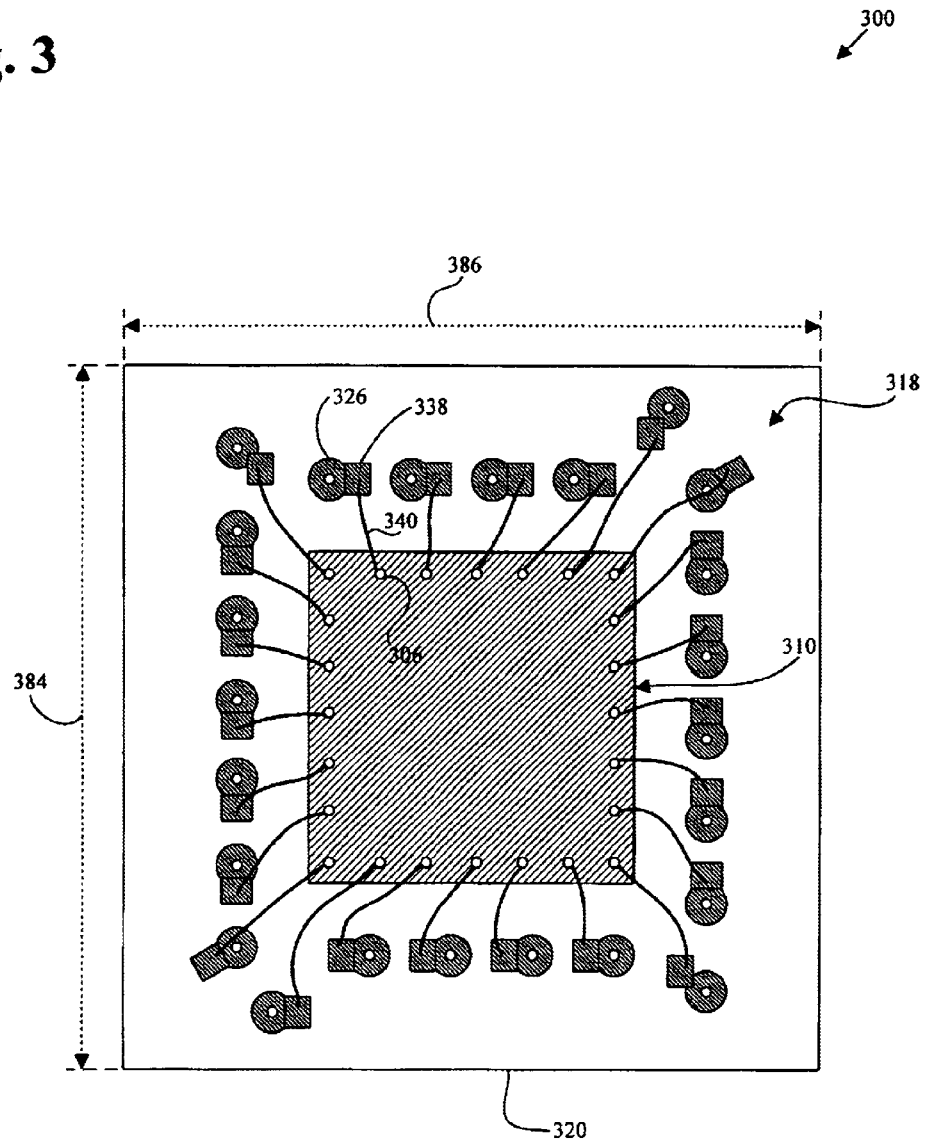
FIG. 3 illustrates a top view of an embodiment of the present invention after completion of a "saw singulation" step.

Structure 300 in FIG. 3 illustrates a top view of an exemplary structure in accordance with one embodiment of the present invention after completion of a "saw singulation" step which, briefly, involves dicing substrate 120 (FIG. 1) so as to achieve a "singulated" structure such as structure 100 in FIG. 1, corresponding to structure 300 in FIG. 3. The saw singulation step is one of the last steps in a process that is described in more detail in relation to FIG. 5. Structure 300 thus comprises substrate 320 corresponding to substrate 120 in FIG. 1. However, in contrast to structure 100 in FIG. 1, in structure 300 substrate bond pads abut, instead of overlap, the vias. For example, substrate signal bond pad 338 is shown as abutting, and not overlapping, via 326. This is in contrast to substrate signal bond pad 138 in FIG. 1, which is shown as overlapping, and not abutting, via 126. Continuing with structure 300, a first end of bonding wire 340 is bonded to substrate signal bond pad 338. A second end of bonding wire 340 is bonded to semiconductor die signal bond pad 306 on semiconductor die 310. It is noted that in FIG. 3, only via 326, substrate signal bond pad 338, bonding wire 340, and semiconductor die signal bond pad 306 are specifically discussed herein to preserve brevity.

The shape of structure 300 in FIG. 3 can be square. For example, side 384 and side 386 of substrate 320 in singulated structure 300 can each be 4.0 millimeters. By way of other examples, other square-shaped "package sizes" can be 5.0 millimeters by 5.0 millimeters, 6.0 millimeters by 6.0 millimeters, or 7.0 millimeters by 7.0 millimeters. In another embodiment, the shape of structure 300 can be rectangular. The "package size" of a rectangular-shaped embodiment can be 3.9 millimeters by 4.9 millimeters. By way of other examples, other "package sizes" of the rectangular-shaped embodiment can be 4.4 millimeters by 6.5 millimeters or 4.4 millimeters by 7.8 millimeters.

Figure 4:
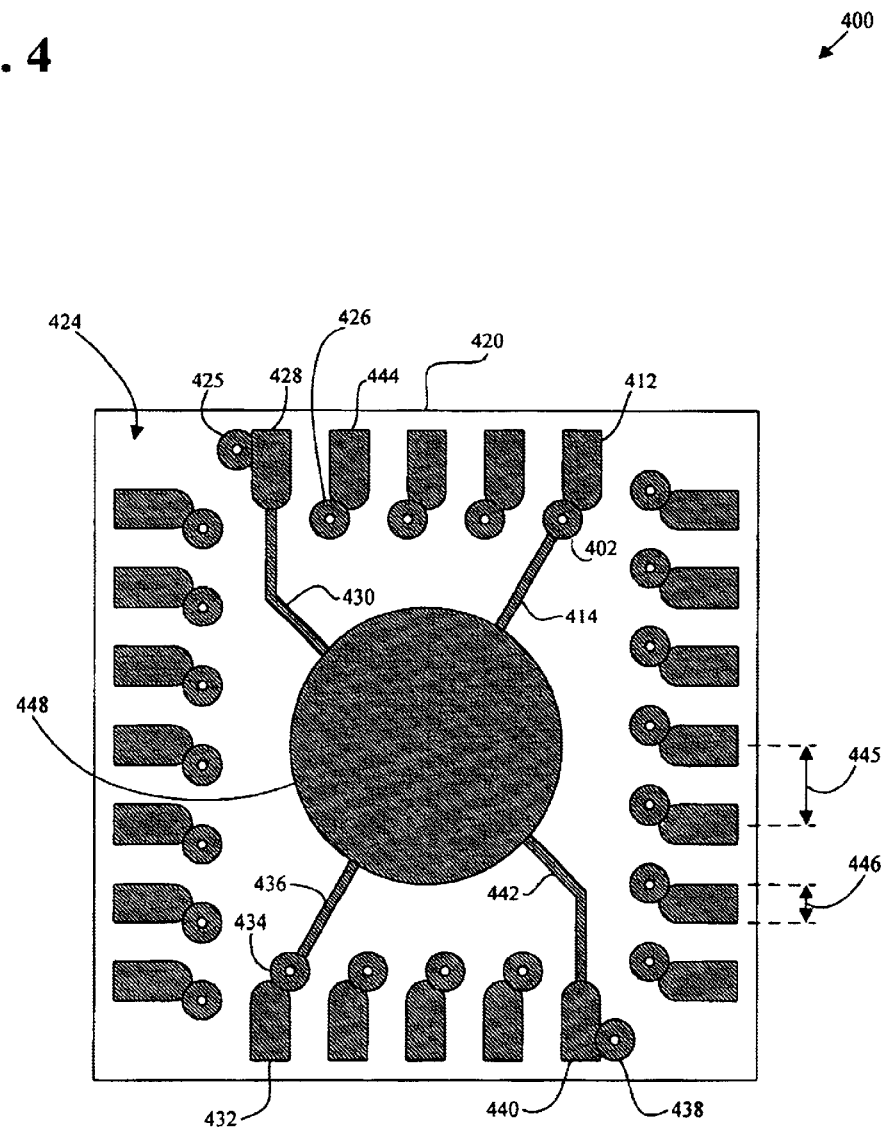
FIG. 4 illustrates a bottom view of an embodiment of the present invention after completion of a "saw singulation" step.

Structure 400 in FIG. 4 illustrates a bottom view of an exemplary structure in accordance with one embodiment of the present invention after completion of a "saw singulation" step. Structure 400 comprises substrate 420 corresponding to substrate 120 in FIG. 1. However, in contrast to structure 100 in FIG. 1, in structure 400 lands abut, instead of overlap, the vias. For example, land 444 is shown abutting, and not overlapping, via 426. This is in contrast to land 144 in FIG. 1, which is shown as overlapping, and not abutting, via 126. Additionally, traces that connect lands and vias to a heat spreader, such as traces 414, 430, 436, and 442 in FIG. 4, are not shown in structure 100 in FIG. 1.

Now discussing FIG. 4 in more detail, FIG. 4 shows bottom surface 424 of substrate 420. Lands 412, 428, 432, 440 and 444, respectively, abut vias 402, 425, 434, 438 and 426. Trace 414 connects via 402 and heat spreader 448. Trace 436 connects via 434 and heat spreader 448. Trace 430 connects land 428 and heat spreader 448. Trace 442 connects land 440 and heat spreader 448. Therefore, vias 402, 425, 434, and 438, respectively, are connected by traces 414, 430, 436, and 442 to heat spreader 448. In the exemplary embodiment shown in FIG. 4, "land pitch" 445 can be, for example, 500.0 microns and "land width" 446 can be, for example, 250.0 microns. It is noted that in FIG. 4, only vias 402, 425, 426, 434, and 438 and lands 412, 428, 432, 440, and 444 are specifically discussed herein to preserve brevity. In another embodiment, "ground traces," such as traces 414, 430, 436, and 442 in FIG. 4, are not used at all. As such, lands 412, 428, 432, and 440 in FIG. 4, would not be connected to a ground, such as heat spreader 448 in FIG. 4, but would be used as ordinary "signal" lands.

Figure 5:
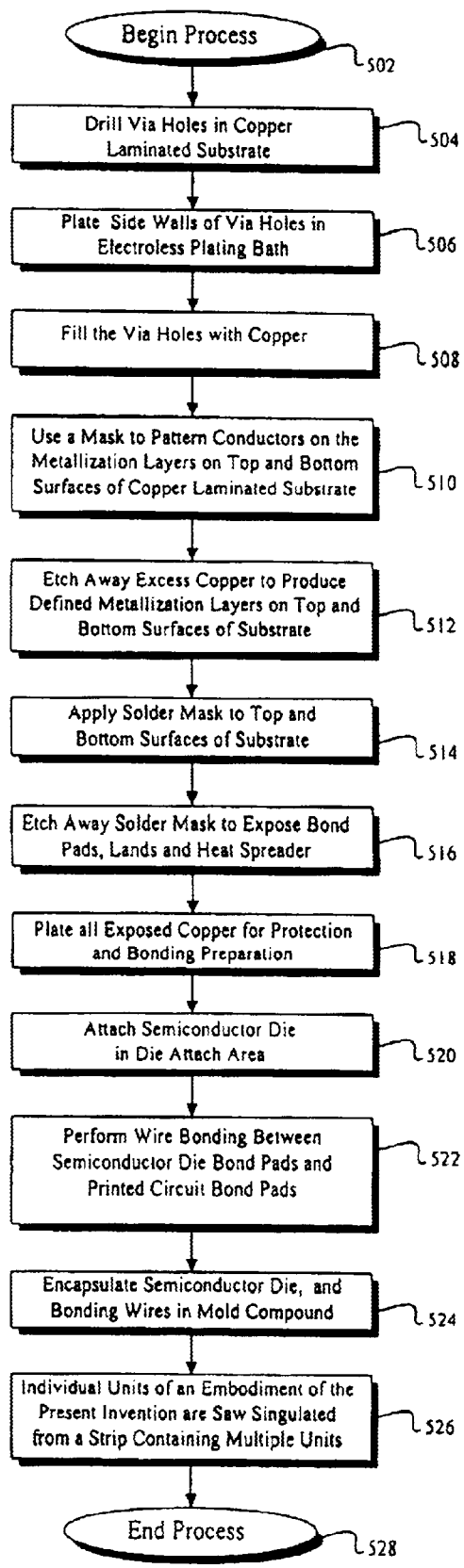
FIG. 5 illustrates a flow chart of an exemplary process by which an embodiment of the present invention is fabricated.

Referring to FIG. 5, an example of a process by which structure 100 in FIG. 1 is fabricated is now discussed. At step 502 the process begins. At step 504, via openings are drilled in a strip of copper laminated substrate. For example, the strip can be an 18-inch by 24-inch panel of copper laminated substrate. Substrate 120 in FIG. 1 corresponds to a section of the strip of the copper laminated substrate. Typically, multiple units of structure 100 are assembled on the strip of copper laminated substrate. In a later step in the assembly process, multiple assembled units of structure 100 are separated into individual units. The diameter of the via openings drilled in the copper laminated substrate can be approximately 150.0 microns.

Typically, all via openings are drilled at once using multiple diamond bits. At step 506, the sidewalls of the via openings are plated with copper in an electroless plating bath. By way of background, electroless plating refers to a method of plating that involves the deposition of metals such as copper, nickel, silver, gold, or palladium on the surface of a variety of materials by means of a reducing chemical bath. As a result of the electroless plating bath, the vias provide electrical and thermal conduction between the top and bottom surfaces of the copper laminated substrate. In one embodiment, after completion of the electroless plating process, the via hole, such as via hole diameter 260 in FIG. 2B, is approximately 110.0 microns.

At step 508, the via openings are filled with copper. Adding additional copper to the via openings increases the thermal conductivity of the vias by providing a larger cross-sectional area for thermal flow. Also, providing a larger cross-sectional area for electrical current flow increases the electrical conductivity of the vias. In the present embodiment, the via openings are partially (or almost completely) filled with copper, while in another embodiment the via openings are completely filled with copper. In one embodiment of the invention, the vias are filled with tungsten. In that embodiment, the tungsten-filled vias are strong enough to allow bonding directly onto the vias.

At step 510, a mask is used to pattern conductors on the metallization layers on the top and bottom surfaces of the substrate. In the present exemplary embodiment, the metallization layers can be copper. At step 512, the excess copper is etched away, resulting in a defined metal interconnect or metal trace pattern, also referred to as a printed circuit, on the top and bottom surfaces of the substrate. For example, in structure 400 in FIG. 4, a patterned metallization layer on bottom surface 424 includes, among other things, heat spreader 448, lands 412, 418, 428, 432, and 440, and traces 414, 430, 436, and 442.

In step 514, solder mask is applied to the top and bottom surfaces of the substrate, thereby covering the exposed patterned copper on the top and bottom surfaces of the substrate. Solder mask improves the adhesive quality of the die attach used to secure the semiconductor die to the top surface of the substrate. For example, in structure 100 in FIG. 1, solder mask 113 improves the adhesive quality of die attach 112 in securing semiconductor die 110 to top surface 118 of substrate 120. Solder mask also prevents contamination of the substrate signal bond pads, substrate down bond areas, and lands.

In step 516, solder mask is etched away to expose copper in the printed circuit areas where bonding and soldering would take place. For example, solder mask is etched away to expose substrate down bond area 114, substrate signal bond pads 132 and 138, lands 144 and 146, and heat spreader 148 in FIG. 1. In step 518, the exposed copper in the printed circuit areas, where bonding and soldering would take place, is plated with a layer of nickel, followed by a layer of gold plating on top of the nickel plated copper. The gold/nickel plating protects the exposed copper from oxidation. Also, the gold/nickel plating prepares the exposed copper for bonding at the bond pads and substrate down bond areas of the printed circuit, such as substrate signal bond pads 132 and 138 and substrate down bond area 114 in FIG. 1. Additionally, the gold/nickel plating prepares the exposed copper for soldering at the printed circuit lands and heat spreader, such as lands 144 and 146 and heat spreader 148 in FIG. 1.

At step 520, a semiconductor die is attached to the die attach pad with a die attach material. In structure 100 in FIG. 1, for example, semiconductor die 110 is attached to die attach pad 111 with die attach 112. As stated above, die attach pad 111 can be AUS-5 solder mask and it (i.e. die attach pad 111) refers to the segment of the solder mask directly below semiconductor die 110. The die attach material, for example, attach 112 in FIG. 1, can comprise silver-filled epoxy or bismalemide. Generally the die attach material can be an electrically conductive or electrically insulative, thermoset adhesive, or a combination thereof. In another embodiment of the present invention, the semiconductor die can be directly soldered to a support pad, such as support pad 117 in FIG. 1.

At step 522, wire bonding is performed between semiconductor die bond pads, such as semiconductor die signal bond pads 104 and 106 in FIG. 1, and printed circuit bond pads, such as substrate signal bond pads 132 and 138 in FIG. 1. In structure 300 in FIG. 3, for example, wire bonding is performed between semiconductor die bond pad 306 and substrate signal bond pad 338. In structure 100 in FIG. 1, the bonding wires used for wire bonding, such as signal bonding wires 134 and 140, can comprise gold. At step 524, the semiconductor die and the bonding wires, such as semiconductor die 110, signal bonding wires 134 and 140, and down bonding wire 116 in FIG. 1, are encapsulated in an appropriate mold compound. The mold compound provides protection from chemical contamination or physical damage in subsequent manufacturing processes and during use. The mold compound, for example, can comprise various chemical compounds, such as multifunctional epoxy, novolac, and biphenyl resin, or a combination thereof.

At step 526, the strip containing multiple assembled units of structure 100 is saw singulated into individual units. In saw singulation, individual assembled units of structure 100 are diced from the strip containing multiple assembled units of structure 100 to result in a large number of structures such as structure 100. It is noted that the process described by reference to FIG. 5 is only one method of fabricating structure 100 in FIG. 1. It is also noted that variations and modifications to the overall method or to each individual step discussed in relation to FIG. 5 are obvious to a person of ordinary skill in the art. At step 528, the exemplary process by which structure 100 in FIG. 1 is fabricated ends.

Figure 6:
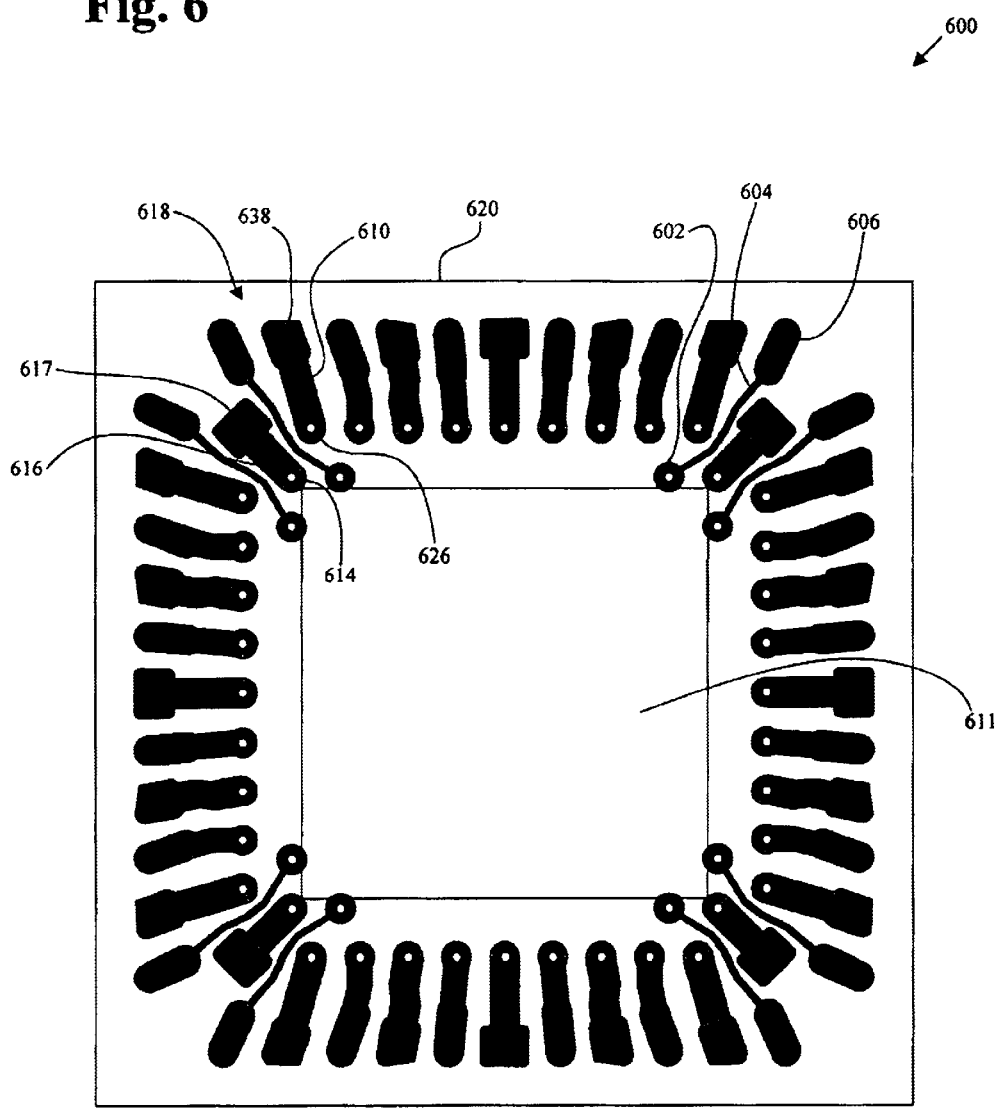
FIG. 6 illustrates a bottom view of an embodiment of the present invention after completion of a "saw singulation" step.

Structure 600 in FIG. 6 illustrates a top view of an exemplary structure in accordance with one embodiment of the present invention after completion of a "saw singulation" step. However, the semiconductor die and bonding wires are not shown in FIG. 6. Structure 600 comprises substrate 620 corresponding to substrate 120 in FIG. 1. However, in contrast to structure 100 in FIG. 1, in structure 600 substrate bond pads are connected to vias by traces. For example, trace 610 connects substrate signal bond pad 638 and via 626. In contrast, in structure 100 in FIG. 1, the bond pads overlap the vias. For example, substrate signal bond pad 138 overlaps via 126 in FIG. 1.

FIG. 6 shows top surface 618 of substrate 620. Trace 604 connects substrate bond pad 606 and via 602. As stated above, trace 610 connects substrate bond pad 638 and via 626. Trace 616 connects substrate bond pad 617 and via 614. FIG. 6 also shows the top view of die attach pad 611. It is noted that in FIG. 6, only vias 602, 626, and 614, traces 604, 610, and 616, and substrate bond pads 606, 617, and 638 are specifically discussed herein to preserve brevity.

In structure 600 in FIG. 6, via 602 is situated adjacent to die attach pad 611. Via 602 can be connected to a common ground connection, not shown in FIG. 6, such as support pad 117 in structure 100 in FIG. 1. Via 614 is situated at a corner of die attach pad 611. In structure 600, via 614 can be connected to a common ground connection, not shown in FIG. 6, such as support pad 117 in structure 100 in FIG. 1. In structure 600 in FIG. 6, "peripheral" vias, such as via 626, typically function as "signal" vias.

As stated above, in structure 600 in FIG. 6, traces 604, 610, and 616, respectively, connect substrate bond pads 606, 638, and 617 to vias 602, 626, and 614. Traces 604, 610, and 616 have different lengths. As seen in FIG. 6, substrate bond pads 606, 638, and 617, respectively, are at different distances from vias 602, 626, and 614. Also, trace 604 and trace 616 have different widths. As such, structure 600 in FIG. 6 provides design flexibility in the utilization of various substrate bond pad and via locations, trace lengths and trace widths.

Figure 7:
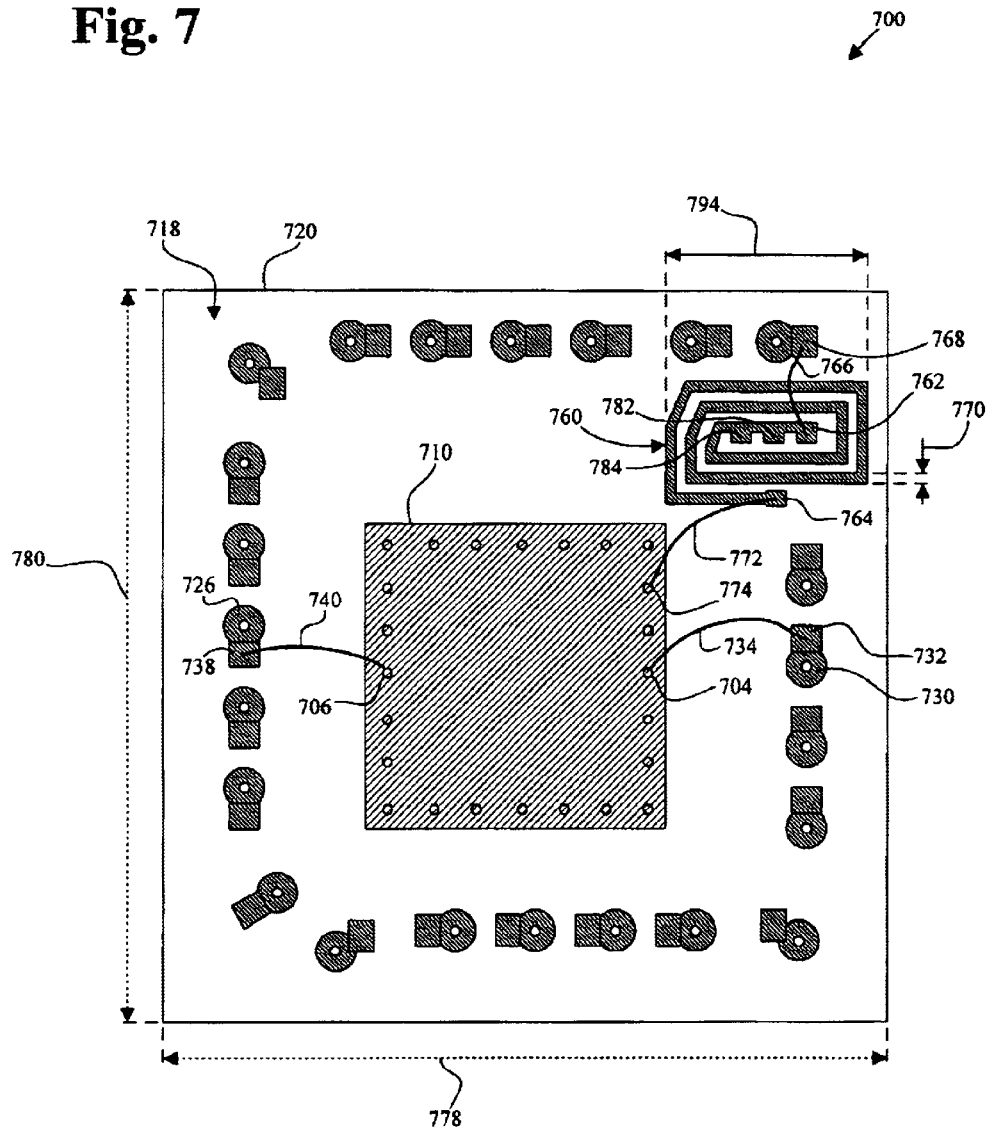
FIG. 7 illustrates an inductor patterned on a top surface of a substrate of a structure according to one embodiment of the present invention.

Structure 700 in FIG. 7 illustrates a top view of an exemplary structure in accordance with one embodiment of the present invention after completion of a "saw singulation" step. Structure 700 comprises substrate 720 corresponding to substrate 120 in FIG. 1. However, in contrast to structure 100 in FIG. 1, structure 700 includes embedded inductor 760 on top surface 718 of substrate 720. Additionally, in contrast to structure 100 in FIG. 1, in structure 700 substrate bond pads abut, instead of overlap, the vias. For example, substrate signal bond pad 738 is shown as abutting, and not overlapping, via 726. This is in contrast to substrate signal bond pad 138 in FIG. 1, which is shown as overlapping, and not abutting, via 126.

Now discussing FIG. 7 in more detail, semiconductor die 710 is attached to a die attach pad by a die attach material on top surface 718 of substrate 720. The die attach pad and die attach material are not shown in FIG. 7. Substrate 720 can comprise a two-layer organic laminate such as polytetrafluoroethylene. However, substrate 720 can comprise other organic materials such as FR4 based laminate. In one embodiment, substrate 720 can be a ceramic material such as aluminum oxide ($Al_2O_3$). In structure 700 in FIG. 7, the thickness of substrate 720 can be approximately 100.0 to 150.0 microns; however, the thickness of substrate 720 can be different in other embodiments of the invention.

Also as shown in FIG. 7, a first end of signal bonding wire 734 is bonded to semiconductor die signal bond pad 704 on semiconductor die 710, and a second end of signal bonding wire 734 is bonded to substrate signal bond pad 732. A first end of signal bonding wire 740 is bonded to semiconductor die signal bond pad 706 on semiconductor die 710, and a second end of signal bonding wire 740 is bonded to substrate signal bond pad 738. Signal bonding wires 734 and 740, respectively, correspond to signal bonding wires 134 and 140 in structure 100 in FIG. 1, and generally comprise the same material as signal bonding wires 134 and 140. Signal bonding wires 734 and 740 can comprise gold or another metal such as aluminum. The diameter of signal bonding wires 734 and 740 can be 30.0 microns or other diameter of choice.

In FIG. 7, substrate signal bond pads 732 and 738 are fabricated on top surface 718 of substrate 720. Substrate signal bond pads 732 and 738, respectively, correspond to substrate signal bond pads 132 and 138 and generally comprise the same material as substrate signal bond pads 132 and 138. In structure 700, substrate signal bond pads 732 and 738 can comprise nickel-plated copper. Substrate signal bond pads 732 and 738 can further comprise a layer of gold plating over the nickel-plated copper. However, substrate signal bond pads 732 and 738 can comprise other metals. For example, substrate signal bond pads 732 and 738 can comprise aluminum, molybdenum, tungsten, or gold. In structure 700 in FIG. 7, substrate signal bond pads 732 and 738, respectively, abut vias 730 and 726. In another embodiment of the present invention, instead of abutting vias 730 and 726, substrate signal bond pads 732 and 738, respectively, can overlap vias 730 and 726.

Continuing with FIG. 7, vias 726 and 730 are situated within substrate 720. Vias 726 and 730, respectively, correspond to vias 126 and 130 in structure 100 in FIG. 1, and generally comprise the same material as vias 126 and 130. In structure 700, vias 726 and 730 can comprise copper and, in fact, in exemplary structure 700, vias 726 and 730 are filled with copper. However, vias 726 and 730 can be filled with other metals without departing from the scope of the present invention.

Also shown in FIG. 7, inductor 760 is fabricated on top surface 718 of substrate 720. In structure 700, inductor 760 can comprise a conductor such as copper; however, inductor 760 can comprise other metals. For example, inductor 760 can comprise aluminum, molybdenum, tungsten, or gold. In structure 700, inductor 760 is an "spiral" inductor; however, inductor 760 can have other shapes without departing from the scope of the invention. In structure 700, length 794 of inductor 760 can be approximately 1.5 millimeters, while segment width 770 can be approximately 50.0 to 75.0 microns. The thickness of the metal segments (or metal "turns") making up inductor 760 can be approximately 20.0 microns. In the present embodiment, inductor 760 can be fabricated to have an inductance in a range of approximately 0.7 to 15.0 nH. However, in other embodiments of the invention, the inductance of inductor 760 can reach a range as high as 60.0 to 70.0 nH. By way of example, in the present embodiment, the Q ("quality factor") of inductor 760 can be approximately 73.0 at a frequency of 2.0 GHz.

In structure 700, a first end of signal bonding wire 766 can be bonded to inductor 760 at alternate locations. For example, the first end of signal bonding wire 766 can be bonded to terminal 762 of inductor 760. Alternatively, the first end of signal bonding wire 766 can be bonded to terminal 782 of inductor 760. As another alternative, the first end of signal bonding wire 766 can be bonded to terminal 784 of inductor 760. A second end of signal bonding wire 766 is bonded to substrate signal bond pad 768. A first end of signal bonding wire 772 is bonded to terminal 764 of inductor 760, and a second end of signal bonding wire 772 is bonded to semiconductor die signal bond pad 774.

Continuing with FIG. 7, signal bonding wires 766 and 772 can be gold or can comprise other metals such as aluminum. The diameter of signal bonding wires 766 and 772 can be 30.0 microns or other diameter of choice. In structure 700, terminals 762, 764, 782, and 784 of inductor 760 can comprise nickel-plated copper. Terminals 764 and 766 can further comprise a layer of gold plating over the nickel-plated copper. However, terminals 762, 764, 782, and 784 can comprise other metals, such as aluminum, molybdenum, tungsten, or gold. It is noted that in FIG. 7, only vias 726 and 730, substrate signal bond pads 732, 738, and 768, semiconductor signal bond pads 704, 706, and 774, and signal bonding wires 734, 740, 772, and 766 are specifically discussed herein to preserve brevity.

The shape of structure 700 in FIG. 7 can be square. For example, side 778 and side 780 of substrate 720 in singulated structure 700 can each be 5.0 millimeters. By way of other examples, other square-shaped "package sizes" can be 4.0 by 4.0 millimeters, 6.0 by 6.0 millimeters, or 7.0 by 7.0 millimeters. In another embodiment, the shape of structure 700 can be rectangular. As an example, the "package size" of a rectangular-shaped embodiment can be 3.9 millimeters by 4.9 millimeters. By way of other examples, other "package sizes" of the rectangular-shaped embodiment can be 4.4 by 6.5 millimeters or 4.4 by 7.8 millimeters.

Figure 8:
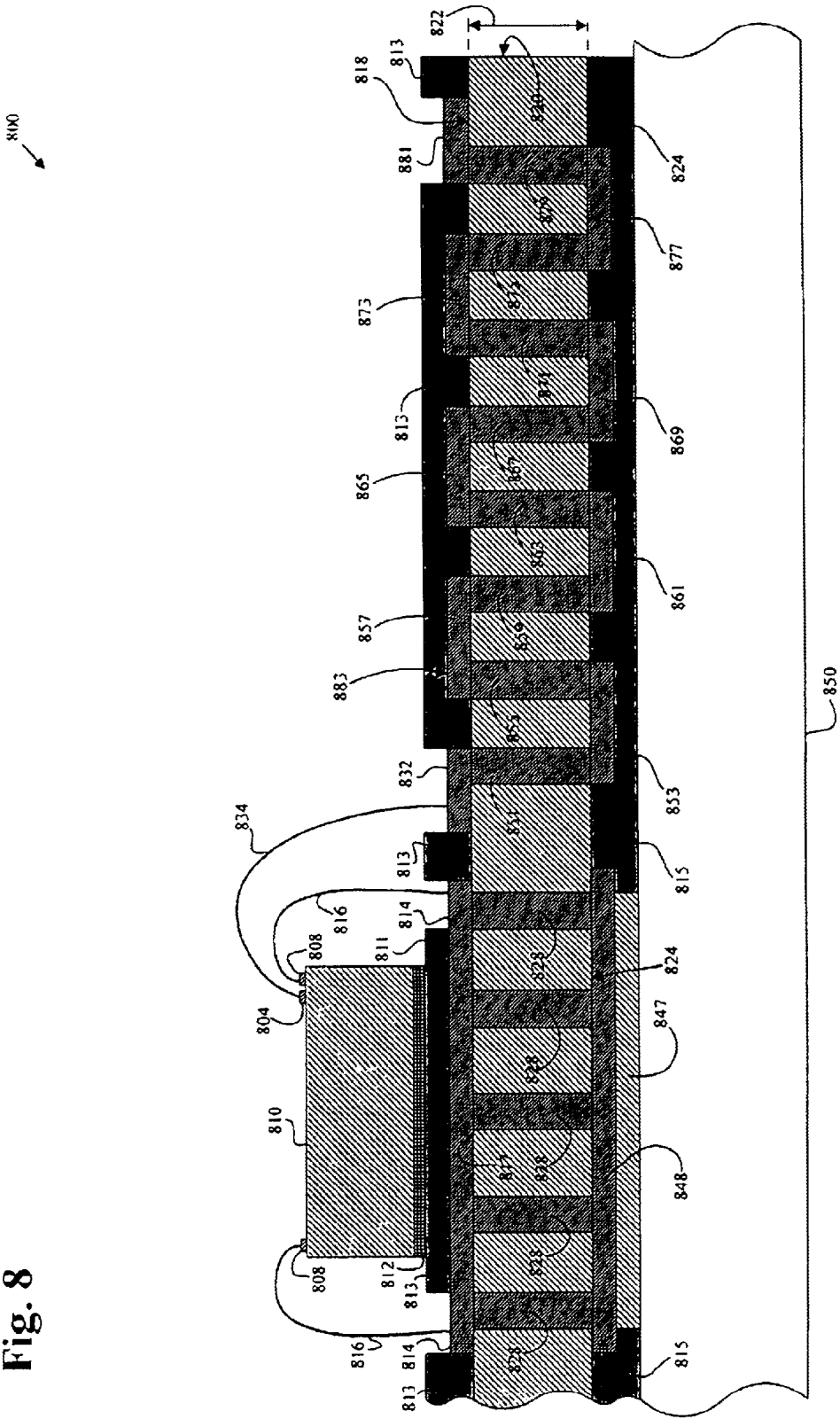
FIG. 8 illustrates an inductor patterned within a substrate of a structure according to one embodiment of the present invention.

Structure 800 in FIG. 8 illustrates a cross-sectional view of an exemplary structure in accordance with one embodiment of the present invention. Structure 800 comprises substrate 820 corresponding to substrate 720 in FIG. 7, and also corresponding to substrate 120 in FIG. 1. However, in contrast to structure 100 in FIG. 1, structure 800 includes inductor 883. Additionally, in contrast to structure 700 in FIG. 7, in structure 800 substrate signal bond pads overlap, instead of abut, the vias. For example, substrate signal bond pad 832 is shown as overlapping, and not abutting, via 851. This is in contrast to substrate signal bond pad 732 in FIG. 7, which is shown as abutting, and not overlapping, via 730.

Continuing with FIG. 8, semiconductor die 810 is attached to die attach pad 811 by die attach 812. Die attach pad 811 corresponds to die attach pad 111 in structure 100 in FIG. 1, and generally comprises the same material as die attach pad 111. Die attach pad 811 can be AUS-5 solder mask and it (i.e. die attach pad 811) refers to the segment of the solder mask directly below semiconductor 810. However, die attach pad 811 may comprise materials other than solder mask. The thickness of die attach pad 811 can be, for example, 10.0 to 30.0 microns. Die attach 812 corresponds to die attach 112 in structure 100 in FIG. 1, and generally comprises the same material as die attach 812. Die attach 812 can comprise silver-filled epoxy or bismalemide. Generally die attach 812 can be an electrically conductive or electrically insulative, thermoset adhesive, or a combination thereof. However, in the present embodiment of the invention, die attach 812 is electrically and thermally conductive.

Solder mask 813 is applied to top surface 818 of substrate 820. Solder mask 813 corresponds to solder mask 113 in structure 100 in FIG. 1, and generally comprises the same material as solder mask 113. Solder mask 813 can be AUS-5; however, solder mask 813 may comprise other materials. The thickness of solder mask 813 can be, for example, 10.0 to 30.0 microns. Solder mask 815 is applied to bottom surface 824 of substrate 820. Solder mask 815 corresponds to solder mask 115 in structure 100 in FIG. 1, and is generally comprised of the same material as solder mask 115. Solder mask 815 can also be AUS-5; however, solder mask 815 may comprise other materials. The thickness of solder mask 815 can also be, for example, 10.0 to 30.0 microns.

Substrate 820 can comprise a two-layer organic laminate such as polytetrafluoroethylene. However, substrate 820 can comprise other organic materials such as FR4 based laminate. In one embodiment of the present invention, substrate 820 can be a ceramic material such as aluminum oxide ($Al_2O_3$). In structure 800, thickness 822 of substrate 820 can be approximately 100.0 to 150.0 microns; however, thickness 822 of substrate 820 can be different in other embodiments of the invention.

Continuing with FIG. 8, support pad 817 is fabricated on top surface 818 of substrate 820. Support pad 817 corresponds to support pad 117 in structure 100 in FIG. 1, and generally comprises the same material as support pad 117. In one embodiment, support pad 817 can be copper; however, support pad 817 can comprise other metals. For example, support pad 817 can be aluminum, molybdenum, tungsten, or gold. It is noted that in one embodiment of the invention, semiconductor die 810 can be soldered directly to support pad 817.

Substrate down bond area 814 is fabricated on top surface 818 of substrate 820. Substrate down bond area 814 corresponds to substrate down bond area 114 in structure 100 in FIG. 1, and generally comprises the same material as substrate down bond area 114. Substrate down bond area 814 can comprise nickel-plated copper. Substrate down bond area 814 can further comprise a layer of gold plating over the nickel-plated copper. However, substrate down bond area 814 can comprise other metals, such as aluminum, molybdenum, tungsten, or gold.

Also shown in FIG. 8, a first end of down bonding wire 816 is bonded to semiconductor die ground bond pad 808, on semiconductor die 810, and a second end of down bonding wire 816 is bonded to substrate down bond area 814. Down bonding wire 816 corresponds to down bonding wire 116 in structure 100 in FIG. 1, and generally comprises the same material as down bonding wire 116. Down bonding wire 816 can be gold, or can comprise other metals such as aluminum. The diameter of down bonding wire 816 can be approximately 30.0 microns or other diameter of choice. As further shown in FIG. 8, a first end of signal bonding wire 834 is bonded to semiconductor die signal bond pad 804 on semiconductor die 810, and a second end of signal bonding wire 834 is bonded to substrate signal bond pad 832. Signal bonding wire 834 corresponds to signal bonding wire 134 in structure 100 in FIG. 1, and generally comprises the same material as signal bonding wire 134. Signal bonding wire 834 can be gold or can comprise other metals such as aluminum. The diameter of signal bonding wire 834 can be 30.0 or other diameter of choice.

Continuing with FIG. 8, substrate signal bond pad 832 is fabricated on top surface 818 of substrate 820. Substrate signal bond pad 832 corresponds to substrate signal bond pad 132 in structure 100 in FIG. 1, and generally comprises the same material as substrate signal bond pad 132. In structure 800, substrate signal bond pad 832 can comprise nickel-plated copper. Substrate signal bond pad 832 can further comprise a layer of gold plating over the nickel-plated copper. However, substrate signal bond pad 832 can comprise other metals, such as aluminum, molybdenum, tungsten, or gold. In structure 800 in FIG. 8, substrate signal bond pad 832 overlaps via 851. In another embodiment of the present invention, substrate signal bond pad 832 can abut via 851. Substrate signal bond pad 832 is utilized as a first terminal of inductor 883.

Also in FIG. 8, substrate signal bond pad 881 is fabricated on top surface 818 of substrate 820. Substrate signal bond pad 881 can comprise nickel-plated copper. Substrate signal bond pad 881 can further comprise a layer of gold plating over the nickel-plated copper. However, substrate signal bond pad 881 can comprise other metals, such as aluminum, molybdenum, tungsten, or gold. In structure 800 in FIG. 8, substrate signal bond pad 881 overlaps via 879. In another embodiment of the present invention, instead of overlapping via 879, substrate signal bond pad 881 "abuts" via 879. Substrate signal bond pad 881 is utilized as a second terminal of inductor 883.

Vias 828, are situated within substrate 820. Vias 828 extend from top surface 818 to bottom surface 824 of substrate 820. Vias 828 correspond to vias 128 in structure 100 in FIG. 1, and generally comprise the same material as vias 128. Vias 828 can comprise a thermally conductive material. Vias 828 can comprise copper and, in fact, in exemplary structure 800, vias 828 are filled with copper. However, vias 828 can be filled with other metals without departing from the scope of the present invention.

In contrast to inductor 760 in structure 700 which is fabricated as a "spiral" inductor, inductor 883 in structure 800 is fabricated as a "solenoid" structure. Inductor 883 consists of interconnect metal segments 853, 857, 861, 865, 869, 873, and 877, and via metal segments 851, 855, 859, 863, 867, 871, 875, and 879. Substrate signal bond pad 832 is connected to via metal segment 851 at a first end of inductor 883, and substrate signal bond pad 881 is connected to via metal segment 879 at a second end of inductor 883. Interconnect metal segments 857, 865, and 873 are fabricated on top surface 818 of substrate 820. Interconnect segments 857, 865, and 873 can comprise copper; however, interconnect metal segments 857, 865, and 873 can comprise other metals such as aluminum, molybdenum, tungsten, or gold. As further shown in FIG. 8, interconnect metal segments 853, 861, 869, and 877 are fabricated on bottom surface 824 of substrate 820. Interconnect metal segments 853, 861, 869, and 877 can comprise copper; however, interconnect metal segments 853, 861, 869, and 877 can comprise other metals such as aluminum, molybdenum, tungsten, or gold.

As shown in FIG. 8, via metal segments 851, 855, 859, 863, 867, 871, 875, and 879 are situated within substrate 820 and extend from top surface 818 to bottom surface 824 of substrate 820. Via metal segments 851, 855, 859, 863, 867, 871, 875, and 879 can comprise a thermally and electrically conductive material such as copper and, in fact, in exemplary structure 800, via metal segments 851, 855, 859, 863, 867, 871, 875, and 879 are filled with copper. However, via metal segments 851, 855, 859, 863, 867, 871, 875, and 879 can be filled with other metals without departing from the scope of the present invention.

Further shown in FIG. 8, heat spreader 848 is fabricated on bottom surface 824 of substrate 820. Heat spreader 848 corresponds to heat spreader 148 in structure 100 in FIG. 1, and generally comprises the same material as heat spreader 148. In structure 800, heat spreader 848 can be copper; however, heat spreader 848 can comprise other metals such as aluminum, molybdenum, tungsten, or gold. In exemplary structure 800, heat spreader 848 is attached to PCB 850 by solder 847. However, other methods known in the art may be used to attach heat spreader 848 to PCB 850. It is noted that lands, such as lands 144 and 146 in structure 100 in FIG. 1, are not shown in structure 800 in FIG. 8. However, the lands in structure 800 are fabricated on bottom surface 824 of substrate 820, and generally comprise the same material as lands 144 and 146 in structure 100 in FIG. 1.

The operation of inductor 760 in structure 700 in FIG. 7 will now be discussed. As discussed above, inductor 760 in structure 700 is fabricated on top surface 718 of substrate 720. As also stated above, an electrical connection can be made to a first end of inductor 760 by bonding to terminal 764 of inductor 760. An electrical connection can be made to a second end of inductor 760 by bonding to either terminal 762, 782, or 784 of inductor 760. The length of the conductor, i.e. the trace, that forms inductor 760 can be varied by bonding to either terminal 762, 782, or 784 of inductor 760. It is known that the inductance of a conductor is proportional to the conductor's length. Therefore, by bonding to the second end of inductor 760 at either terminal 762, 782, or 784, the inductance of inductor 760 can be varied accordingly. Thus, by providing multiple bond locations at the second end of inductor 760, structure 700 allows the inductance of inductor 760 to be "fine tuned" to more closely match a required inductance in a particular application.

In another embodiment of the present invention, an inductor can be situated underneath a semiconductor die, such as semiconductor die 710 in structure 700. In yet another embodiment, another inductor, similar to inductor 760 in FIG. 7, can be fabricated directly underneath inductor 760 on the bottom surface of substrate 720 in structure 700. Thus, a transformer can be formed in structure 700 by cross-coupling inductor 760 with a similar inductor fabricated beneath inductor 760 on the bottom surface of substrate 720. The cross-coupled inductors, i.e. inductor 760 and the similar inductor fabricated beneath inductor 760 on the bottom surface of substrate 720, can have the same number or a different number of "turns."

It is noted that, as described above, while structure 700 preserves advantages and features of structure 100, structure 700 also includes embedded inductor 760. Inductor 760 is fabricated using process steps similar to that described in relation to FIG. 5 and, as such, the process steps are not repeated here. It is noted that fabrication of inductor 760 occurs concurrently with fabrication of the remaining elements in structure 700. Moreover, semiconductor die signal bond pads, such as semiconductor die signal bond pad 774, are easily connected to a terminal of inductor 760, such as terminal 764, which is being used as a first terminal of inductor 760. It is also noted that a second terminal of inductor 760, such as terminal 762, is also easily accessible through substrate signal bond pad 768. As such, the embedding of inductor 760 does not result in additional fabrication steps or manufacturing costs while resulting in a "built-in" and easy to access inductor of a relatively large inductance value. Thus, structure 700 preserves advantages and features of structure 100 while providing the added benefits of inductor 760.

The operation of structure 800 and inductor 883 in structure 800 in FIG. 8 will now be discussed. As with structure 100 in FIG. 1, structure 800 shares a number of advantages and features in common with structure 100. Moreover, structure 800 has an inductor, i.e. inductor 883, embedded therein. The following presents some of the features and advantages of structure 800 which are in common with structure 100. In structure 800, down bonding wire 816 provides an electrical ground connection between semiconductor die ground bond pad 808 on semiconductor die 810 and substrate down bond area 814. Substrate down bond area 814 is situated in close proximity to semiconductor die 810. By situating substrate down bond area 814 in close proximity to semiconductor die 810, structure 800 provides a minimal length electrical ground connection between semiconductor die ground bond pad 808 and substrate down bond area 814.

Support pad 817 functions as a "ground plane" for semiconductor die 810 by providing semiconductor die ground bond pads with a large common ground connection. Thus, semiconductor die ground pad 808 is electrically connected to substrate down bond area 814 by down bonding wire 816, and substrate down bond area 814 is part of support pad 817. Since substrate down bond area 814 is part of support pad 817, structure 800 provides a minimal length electrical ground connection between semiconductor die ground pad 808 and support pad 817. Also, vias 828 electrically connect support pad 817 and heat spreader 848. Thus, substrate down bond area 814, support pad 817, vias 828, and heat spreader 848 combine to provide a minimal length, low resistance, and low inductance ground connection between semiconductor die ground pad 808 and heat spreader 848.

Additionally, in structure 800 in FIG. 8, a large number of vias 828 can be used. Since vias 828 are electrically connected in parallel between support pad 817 and heat spreader 848, they (i.e. vias 828) provide a much lower resistive and inductive path between support pad 817 and heat spreader 848 than the resistive and inductive path that would have been provided by a single via. Thus, as stated with respect to structure 100 in FIG. 1, through the utilization of multiple vias, such as vias 828 in FIG. 8, structure 800 provides a low resistance, low inductance, minimal length electrical ground connection between support pad 817 and heat spreader 848.

While structure 800 preserves advantages and features of structure 100, structure 800 also includes embedded inductor 883. Inductor 883 is fabricated using process steps similar to that described in relation to FIG. 5 and, as such, the process steps are not repeated here. However, it is noted that fabrication of inductor 883 occurs concurrently with fabrication of the remaining elements in structure 800. In particular, fabrication of inductor 883 is combined with fabrication of support pad 817, vias 828, and heat spreader 848. Moreover, signal bond pads, such as signal bond pad 804 of semiconductor die 810 are easily connected to a terminal of inductor 883, such as substrate signal bond pad 832, which is being used as a first terminal of inductor 883. It is also noted that a second terminal of inductor 883 is also easily accessible through substrate signal bond pad 881. As such, the embedding of inductor 883 does not result in additional fabrication steps or manufacturing costs while resulting in a "built-in" and easy to access inductor of a relatively large inductance value. Thus, structure 800 preserves advantages and features of structure 100 while providing the added benefits of inductor 883.

It is appreciated by the above detailed description that the invention provides structure and method for fabrication of a leadless chip carrier with embedded inductor. The invention also provides efficient dissipation of heat generated by the semiconductor die. Further, the invention provides low parasitics, and a low inductance and resistance ground connection. From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

Thus, structure and method for fabrication of a leadless chip carrier with embedded inductor have been described.

What is claimed is:

1. A structure comprising:
    a substrate having a top surface for receiving a die;
    a conductor patterned on said top surface of said substrate, said conductor having a first terminal and a second terminal, each of said first and second terminals situated on said top surface of said substrate, said first terminal of said conductor being adapted for connection to a first substrate signal bond pad, said first substrate signal bond pad situated on said top surface of said substrate and said second terminal of said conductor being adapted for connection to a first die signal bond pad, said first die signal bond pad situated on said top surface of said substrate;
    a printed circuit board attached to a bottom surface of said substrate;
    at least one via in said substrate;
    said at least one via providing an electrical connection between a second die signal bond pad and said printed circuit board.

2. The structure of claim 1 wherein said die is a semiconductor die.

3. The structure of claim 1 wherein said substrate comprises an organic material.

4. The structure of claim 1 wherein said substrate comprises a ceramic material.

5. The structure of claim 1 wherein said at least one via provides an electrical connection between a second substrate signal bond pad and said printed circuit board, wherein said second substrate signal bond pad is electrically connected to said second die signal bond pad.

6. The structure of claim 5 wherein said second substrate signal bond pad is electrically connected to said second die signal bond pad by a bonding wire.

7. The structure of claim 1 wherein said at least one via provides an electrical connection between said second die signal bond pad and a land, said land being electrically connected to said printed circuit board.

8. The structure of claim 1 wherein said at least one via provides an electrical connection between a second substrate signal bond pad and a land, wherein said second substrate signal bond pad is electrically connected to said second die signal bond pad, and wherein said land is electrically connected to said printed circuit board.

9. The structure of claim 8 wherein said second substrate signal bond pad is electrically connected to said second die signal bond pad by a bonding wire.

10. The structure of claim 1 wherein said at least one via comprises a thermally conductive material.

11. The structure of claim 1 wherein said conductor is an inductor.

12. The structure of claim 11 wherein said first terminal of said inductor is connected to said first substrate signal bond pad and said second terminal of said inductor is connected to said first die signal bond pad.

13. A structure comprising:
    a substrate having a top surface for receiving a die;
    a conductor patterned within said substrate, said conductor comprising an inductor, said conductor having a first terminal and second terminal, each of said first and second terminals situated on said top surface of said substrate, a first substrate signal bond pad being said first terminal of said conductor and a second substrate signal bond pad being said second terminal of said conductor;
    a printed circuit board attached to a bottom surface of said substrate;
    at least one via in said substrate;
    said at least one via providing an electrical connection between a die signal bond pad and said printed circuit board.

14. The structure of claim 13 wherein said die is a semiconductor die.

15. The structure of claim 13 wherein said substrate comprises an organic material.

16. The structure of claim 13 wherein said substrate comprises a ceramic material.

17. The structure of claim 13 wherein said at least one via provides an electrical connection between said die signal bond pad and a land, said land being electrically connected to said printed circuit board.

18. The structure of claim 13 wherein said at least one via comprises a thermally conductive material.

19. The structure of claim 13 wherein said conductor comprises a plurality of via metal segments within said substrate.

20. The structure of claim 19 wherein said conductor is an solenoid inductor.

* * * * *